United States Patent [19]

Seefeldt et al.

[11] Patent Number: 4,864,381
[45] Date of Patent: Sep. 5, 1989

[54] HIERARCHICAL VARIABLE DIE SIZE GATE ARRAY ARCHITECTURE

[75] Inventors: David F. Seefeldt, Palm Bay; Michael J. Iacoponi, Indian Harbor Beach; David K. Vail, Jr., Palm Bay, all of Fla.

[73] Assignee: Harris Corporation, Del.

[21] Appl. No.: 286,175

[22] Filed: Dec. 19, 1988

Related U.S. Application Data

[63] Continuation of Ser. No. 877,387, Jun. 23, 1986, abandoned.

[51] Int. Cl.⁴ ............... H01L 27/10; H01L 27/15
[52] U.S. Cl. ................................. 357/45; 357/68; 357/40; 357/70; 364/491; 307/465
[58] Field of Search ............... 357/45, 68, 70, 40, 357/41; 307/465; 364/491

[56] References Cited

U.S. PATENT DOCUMENTS

| 4,688,072 | 8/1987 | Heath et al. | 357/45 |
| 4,750,027 | 6/1988 | Asami | 357/45 |

FOREIGN PATENT DOCUMENTS

| 0133131 | 7/1984 | European Pat. Off. | 357/45 M |
| 54-2683 | 1/1979 | Japan | 357/68 |
| 58-78450 | 5/1983 | Japan | 357/45 M |
| 58-116757 | 7/1983 | Japan | 357/45 M |
| 58-197747 | 11/1983 | Japan | 357/45 M |

OTHER PUBLICATIONS

Electronics, Mar. 17, 1986, p. 8.
Electronics, Nov. 4, 1985, p. 27.

*Primary Examiner*—Andrew J. James
*Assistant Examiner*—Sara W. Crane
*Attorney, Agent, or Firm*—Antonelli, Terry & Wands

[57] ABSTRACT

A variable die size gate array architecture is realizable by forming in a semiconductor substrate an array of circuit devices separated from one another by a network of routing channels. Through the selective interconnection of the routing channels and the circuit devices a prescribed signal processing function may be implemented. The array of circuit devices includes gate supercells each of which is configurable to perform a respective signal processing operation, and input/output supercells each of which is configurable to effectively perform input/output interfacing between the gate supercells and signal terminals external to the array. The gate supercells and the input/output supercells are intermingled with one another in the array in accordance with a prescribed two-dimensional distribution pattern. Prescribed ones of the gate supercells and input/output supercells within at least one prescribed portion of the array are interconnected to effectively form an integrated circuit architecture capable of implementing the prescribed signal processing function. This portion is then separated from the wafer, and the integrated circuit architecture resident in the separated portion of the array is tab bonded to signal coupling terminals of an integrated circuit chip carrier by way of bonding pads on the input/output supercells.

5 Claims, 3 Drawing Sheets

HIERARCHICAL VARIABLE DIE SIZE GATE ARRAY ARCHITECTURE

This is a continuation of application Ser. No. 877,387, filed June 23, 1986, now abandoned.

FIELD OF THE INVENTION

The present invention relates to integrated circuit chip technology and is particularly directed to a scheme for optimally controlling the die size of a gate array architecture.

BACKGROUND OF THE INVENTION

Integrated circuit technology has produced a variety of semiconductor architectures for realizing microminiaturization of signal processing circuit designs. One such architecture, termed the gate array, employs a semiconductor (e.g. silicon, gallium arsenide) wafer structure that contains dedicated areas on the chip within which are disposed elemental circuit devices (e.g. transistors, gates, flip-flops), interconnect highways and power bus links. By the selective intercoupling of these device links and highways a prescribed signal processing circuit design is mapped into an integrated circuit architecture. In a conventional gate array architecture, one portion of the available area of the chip contains a plurality of logic gates, such as a "sea" of gates or uninterrupted rows of gate cells, while another portion of the chip real estate is dedicated to wiring/interconnect channels through which the gates may be selectively interconnected to realize a multifunction logic circuit. In terms of gate cell layout, the chip will typically have a central portion thereof dedicated to a logic function cell area, while input/output cells will be distributed around the perimeter of the central cell area.

Because of the variable complexity of signal processing circuit designs, gate array architectures have been sized to contain predetermined numbers of gate cells, each of which has a respective capacity sufficient to accommodate up to some maximum number of gate cells. Thus, to efficiently map a completed circuit design into an integrated circuit architecture, the circuit designer will select, from an inventory of preestablished gate array die sizes (e.g. 1K, 2.5K, 5K, 7.5K, 10K and 20K gate cell arrays), that architecture (die) size the number of gate cells of which is closest to but at least as large as the design number.

Unfortunately, maintaining such an inventory of fixed die sizes has a number of disadvantages. First of all, the inventory itself involves significant manufacturing overhead, since each die size is, in effect, a custom architecture requiring its own dedicated mask set. If a design error or processing error occurs, or in the event of a process enhancement, it will become necessary to rework the mask set for each die size. Moreover, because the input/output cells are distributed around the periphery of the chip, the number of such input/output cells that the die may contain is limited by the size of the die. Namely, circuit designs requiring large numbers of input/output devices may be realized through the use of large sized dies, a considerable portion of the logic function cell area of which may go unused.

SUMMARY OF THE INVENTION

In accordance with the present invention, the above-described drawbacks associated with maintaining an inventory of fixed gate arrayed sizes are obviated by a new and improved gate array configuration that effectively provides the circuit designer with a gate array architecture the cell capacity, and consequently size, of which is variable. To this end the gate array architecture of the present invention is comprised of a matrix of intermingled or interdistributed gate supercells and input/output cells selectively interconnectable with one another by a set of global routing channels. The supercells and global routing channels, as well as a distributed arrangement of power tracks, are preferably configured in the manner described in copending U.S. patent application Ser. No. 862,821 filed May 13, 1986, entitled "Hierarchical Gate Array Architecture", by David K. Vail et al, and assigned to the Assignee of the present application. As described in that application, a gate supercell is composed of a matrix of subcells each of which corresponds to either a general purpose gate cell or a custom layout flip-flop. Each general purpose gate cell may be configured of a plurality of MOSFETs the selective interconnection of which within the same subcell or among subcells enables the interconnected MOSFETs to be tailored to implement a variety of logic circuit functions. In accordance with the present invention, each input/output supercell contains a plurality of input/output driver circuits and associated terminal pads arranged to facilitate interconnection to adjacent global routing channels on opposite sides of the input/output supercells. Because the gate supercells and input/output supercells are intermingled with one another, the size and capacity constraints of perimeter located input/output cell arrangements of the prior art are eliminated. Namely, for any circuit design it is possible to optimize the die size by simply scribing a wafer, containing a continuum of intermingled gate supercells and input/output supercells, at boundary lines traversing those global routing channels surrounding the requisite number of supercells and input/output cells to implement the circuit design. Connection between the completed integrated circuit and the outside world is preferably effected by area tab-bonding terminal pads on the input/output supercells to terminal leads of the package to which the scribed die is affixed.

DETAILED DESCRIPTION

Figure 1:
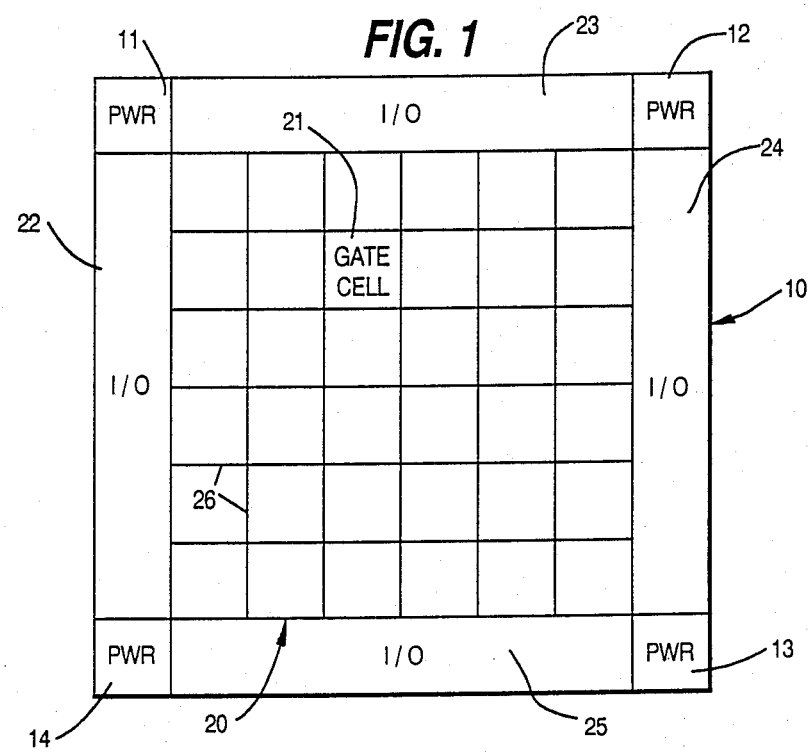
FIG. 1 is a diagrammatic illustration of topology of a gate array architecture composed of a matrix of gate supercells surrounded on its periphery by a bordering arrangement of input/output cells.

In order to facilitate an understanding of the present invention, it is initially useful to consider the configuration of a gate array architecture the die size of which is limited by the manner in which the gate cells are arranged in the interior portion of the array and the input- /output cells therefor are arranged in a pattern bordering the gate cells, thereby defining the boundaries of the architecture and, consequently, the number of cells that are confined within those boundaries. In FIG. 1 there is shown a generalized diagrammatic illustration of the topology of a gate array architecture for an integrated circuit chip 10. For the purposes of the present description, it will be assumed that the architecture is a hierarchical architecture, made-up of a gate array supercell topology and distribution of interconnection links as described in the above-identified copending patent application, the disclosure of which is incorporated by reference herein. As shown in FIG. 1, chip 10 is substantially rectangularly shaped, with respective corners containing power coupling pads 11, 12, 13 and 14. Additional power pads (not shown) may be placed along the borders of the chip, as required. Also distributed along the borders of the chip between the power coupling pads 11-14 are sets 22-25 of input/output cells which provide interfacing between an interior gate cell array 20 and the external world. The gate array itself is comprised of a matrix, e.g. a 6×5 matrix, of thirty supercells 21, as shown; this number is not to be considered limitative, of course. A 6×5 matrix is shown in FIG. 1 for purposes of simplifying the illustration. The array 20 of gate supercells is surrounded and partitioned by a plurality of global routing channels 26 which extend in vertical and horizontal directions and separate the gate supercells from one another. These routing channels include a plurality of interconnection tracks that are disposed between and separate adjacent gate supercells from one another. Each supercell 21 is comprised of a plurality of subcells and dedicated flip-flops which are selectively interconnectable through local routing channels thereamong.

As pointed out above, because the locations of the sets 22-25 of input/output cells effectively define a border or perimeter around the array 20 of gate supercells 21, the die size of the gate array architecture is preestablished by the input/output cell placement. Thus, within the topology of a wafer that is to contain a plurality of die sizes such as that illustrated in FIG. 1, the mask set predefines the die size and the scribe lines for separating the individual die from one another between adjacent perimeters of input/output cells.

As pointed out above, the present invention obviates the die size limitations of gate array architectures that are constrained by border placement of the input/output cells by an architecture which effectively disburses or intermingles input/output supercells among the gate supercells of which the architecture is to be configured.

Figure 2:
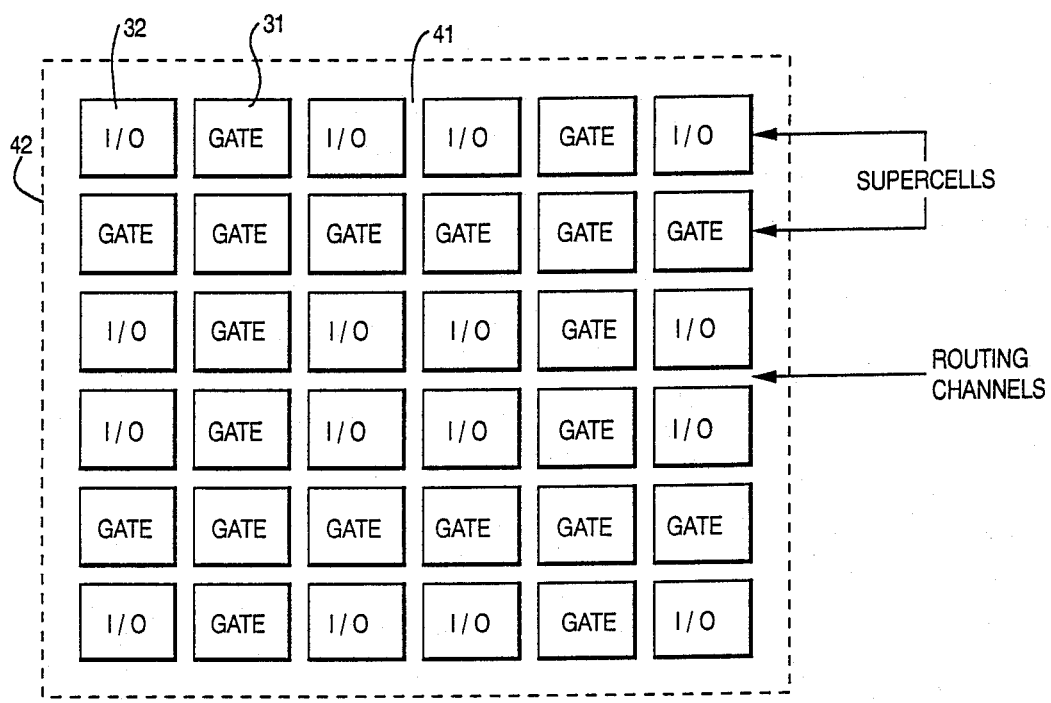
FIG. 2 is a diagrammatic illustration of the topology of a gate array architecture composed of a matrix of interleaved gate supercells and input/output supercells in accordance with the present invention.

FIG. 2 shows a diagrammatic illustration of such disbursement or intermingling of a plurality of input/output supercells among a plurality of gate supercells. As shown in FIG. 2, a plurality of gate supercells 31 (corresponding to the supercells 21 of the arrangement of FIG. 1) and a plurality of input/output supercells 32 (the details of an individual one of which will be described below with reference to FIG. 3) are interspersed or intermingled with one another to form a two-dimensional distribution of both the gate supercells 31 and the input/output supercells 32. In effect, the matrix array shown in FIG. 2 corresponds to the array of supercells employed in FIG. 1 except that some of the gate supercells have been replaced by input/output supercells. The global routing channels among the supercells correspond to those employed in the hierarchical gate array architecture shown generally in FIG. 1 and described in the above-referenced copending application. Thus, the global routing channels provide intercoupling highways among the gate supercells and between input/output supercells and the gate supercells. In FIG. 2, the global routing channels which extend between supercells in the vertical direction or form columns of routing channels are denoted as global routing channels 41, while the global routing channels which extend between supercells in the horizontal direction or form rows of routing channels are denoted as routing channels 42.

Figure 3:
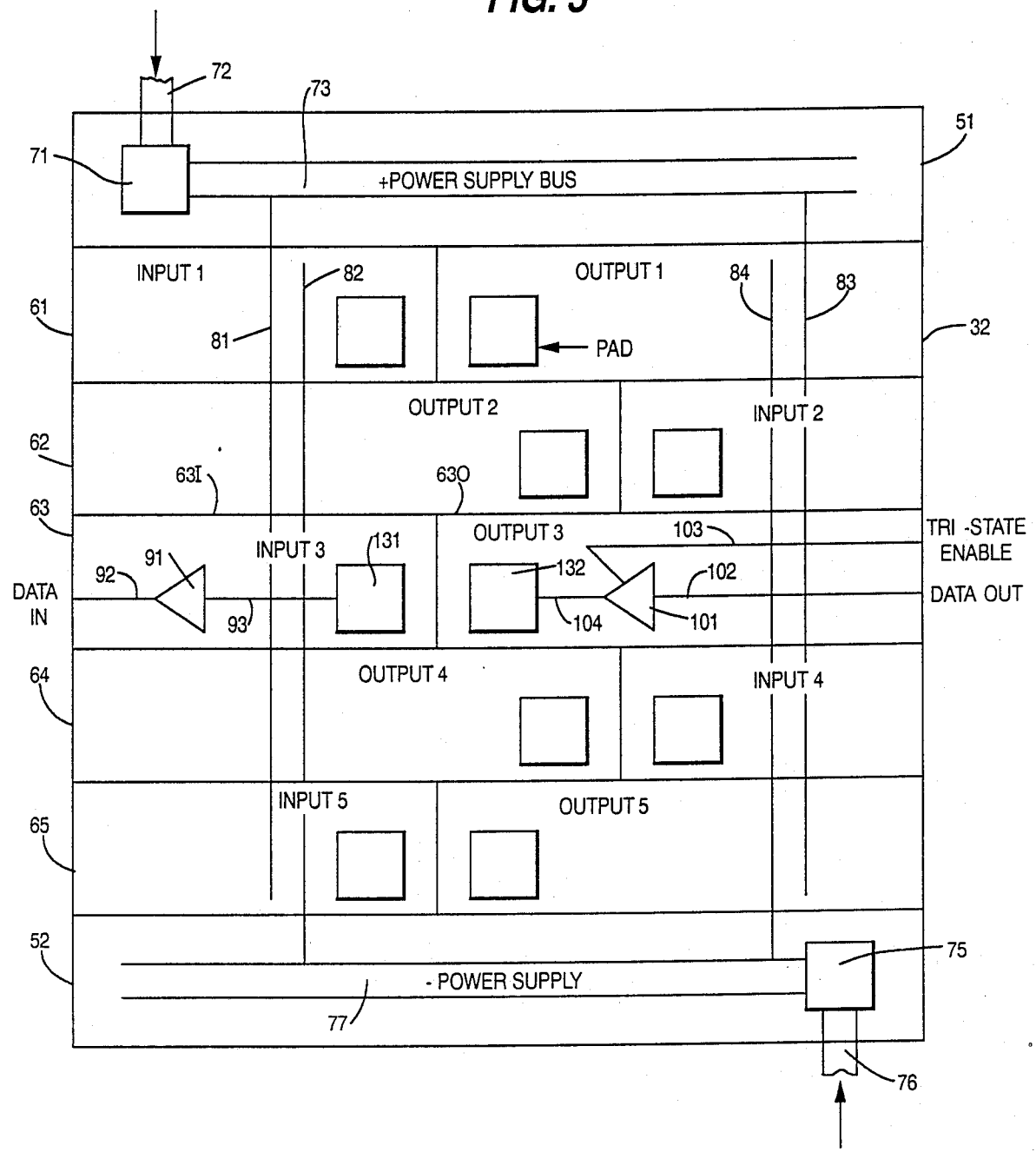
FIG. 3 is a diagrammatic illustration of the topology/circuit functionality of an input/output supercell employed in the intermingled matrix shown in FIG. 3.

The configuration of an individual input/output supercell is shown in FIG. 3 as containing an arrangement of adjacent (e.g. 5 in the illustration) of input/output cells 61-65. Each input/output cell contains an input terminal pad and an output terminal pad by way of which the input/output cell is to be tab-bonded to interconnect highways of a chip carrier upon which the gate array die is to be mounted. In addition to the (five) input/output cells 61-65, each input/output supercell contains a pair of power bus region 51 and 52 along opposite edges of the arrangement of input/output cells 61-65. In FIG. 3, an individual one 63 of the input/output cells is shown as containing an input cell 63I and an adjacent output cell 63O. Input cell 63I has an input terminal pad 131 connected by way of a link 93 to a driver amplifier 91, the output of which is coupled to a link 92 for connection to a global routing channel. Through input terminal pad 131, input cell 63I receives input signals from the outside world and couples those signals through driver 91 and over link 92 to an interconnected global routing channel, connection points of which are disposed adjacent the left-hand edge of the supercell shown in FIG. 3. (The global routing channels themselves are not shown in FIG. 3 to simplify the drawing.)

The output cell 63O contains an output terminal pad 132 which is coupled over a link 104 to an output driver amplifier 101. Output driver amplifier 101 is coupled to an input link 102 and a tri-state enable link 103. Links 102 and 103 extend to the right-hand edge portion of the output cell 63O for interconnection to a global routing channel adjacent the right-hand edge of the input/output supercell shown in FIG. 3.

It will be noted from the illustration in FIG. 3 that adjacent ones of the input/output cells have their terminal pads offset from one another. The purpose of this offset is to facilitate tab-bonding to the terminal pads (namely to prevent misbonding from the carrier interconnect leads for adjacent input/output cells). It is also to be noted that adjacent ones of the input/output cells 61-65 have their internal circuitry of the input/output cells disposed in opposite directions so that, schematically, input/output cells 61 and 65 are identical to input/output cell 63 whereas input/output cells 62 and 64 are schematically identical but oriented in the reverse direction, thereby providing each input/output supercell with the ability to provide input or output connections to global routing channels on either side of the supercell and thereby reduce routing congestion.

Power bus region 51 contains a pad 71 from which extends bus link 72 that is distributed among the global routing channels as a power track among the respective cells, as described in the above-identified copending application. From power pad 71 extend power link 73 for providing a positive polarity voltage to each of the input/output cell pairs. For this purpose, power link 81 extends from power bus 73 for providing power adjacent to the pads and cells in the left-hand portion of the supercell, while link 83 is disposed in the right-hand portion of the supercell for providing a positive voltage along the right-hand edge portion of the supercell. Power bus region 52 is employed for supplying a negative polarity voltage by way of a power bus link 77 which extends from negative voltage supply pad 75. Supply pad 75 is coupled to the power supply tracks that extend through the gate array architecture in the same manner that track 72 extends therethrough as described in the above-referenced copending application. From negative power supply bus 77 there extend power track 82 for supplying power to the left-hand portion of the supercell and power track 84 for supplying power to the right-hand portion of the supercell.

Figure 5:
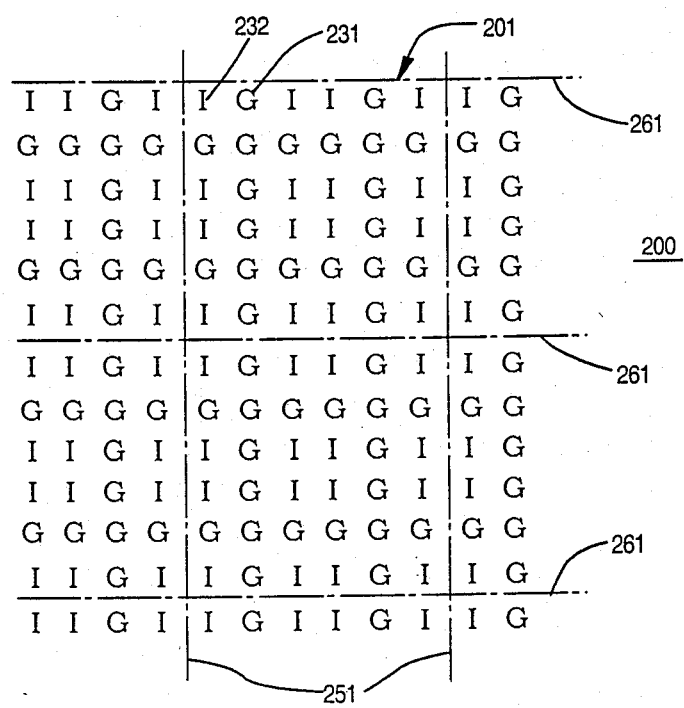
FIG. 5 is an enlarged illustration of the detailed portion of the supercell array shown in FIG. 4.
Figure 4:
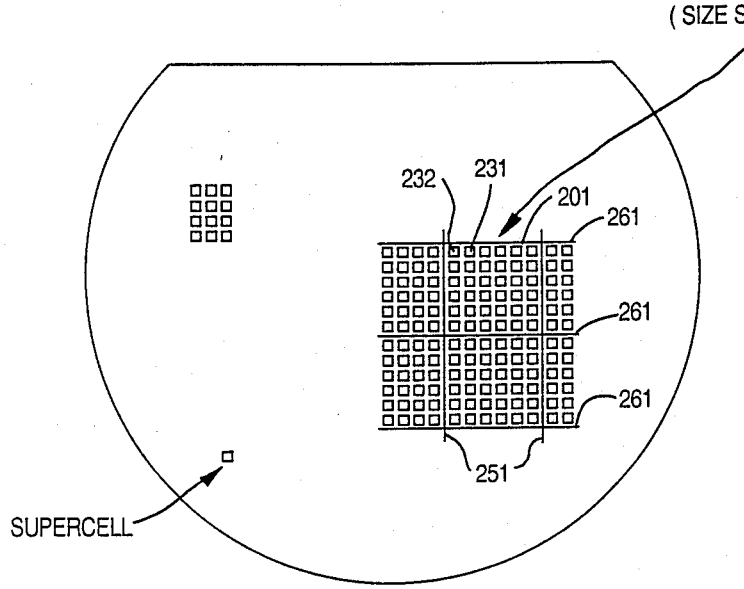
FIG. 4 is a diagrammatic illustration of the topology of a portion of an array of (gate and input/output) supercells within a semiconductor wafer.

Referring now FIGS. 4 and 5, there is shown a diagrammatic illustration of a wafer array made of a continuum of a distribution or intermingling of gate supercells such as gate cells 231 and input/output supercells 232, the layout for an individual die of which was described above with reference to FIG. 2. Because the input/output supercells are distributed among the gate supercell, rather than defining a border or perimeter of a grouping of gate cells, the die size of a particularly gate array architecture is not limited by a border perimeter. Instead, it is variable, being limited only by the practical size of the die into which a prescribed circuit design is to be made mapped. FIG. 5 shows the manner in which the intermingling or distribution of input/output supercells and gate supercells, the pattern for which is illustrated in FIG. 2, referenced above, is repeated in the vertical and horizontal directions across the wafer 200 shown in FIG. 4. Let it be assumed that a prescribed circuit design requires the use of twenty gate supercells and sixteen input/output supercells. With the arrangement shown in FIGS. 2, 4 and 5, that requirement may be met by scribing the wafer along vertical scribe lines 251 and horizontal scribe lines 261 to obtain a 6×6 supercell matrix configuration shown in FIG. 2 as a die 201 within the wafer 200 as shown in FIG. 4. In FIGS. 4 and 5, the individual gate supercells corresponding to supercells 31 in FIG. 2 are shown as gate supercells 231 while the input/output supercells corresponding to the input/output cells 32 of FIG. 2 are shown as input/output supercells 232. In other words, by intermingling the input/output supercells and the gate supercells the size of the gate array and the geometry of the gate array is no longer fixed, as in conventional gate array architectures; rather, by intermingling the input/output supercells and the gate supercells, the die size may be tailored to be both efficient (from a standpoint of matching cell capacity to circuit needs) and wafer slice efficient (by proper orientation of the geometry scribe lines). As shown in FIGS. 2, 4 and 5, the smallest practical pattern of gate supercells and input/output supercells is formed by a 3×3 pattern of five gate cells at the corners of which respective input/output supercells are located. As more gates are needed, the size can readily increase incrementally by the number of supercells required. This is particularly useful in designs, where, for a given gate array or gate array family, the application is near the limits of the fixed size gate array. Thus, if, for example, several additional input/output supercells are required, the area of the die is increased incrementally until the desired input/output supercell needs are satisfied. Also, if a design is increased by several gates, the design can be incremented by to the number of supercells required. Each iteration is accomplished using the same wafer configuration (as shown in FIGS. 4 and 5) by simply changing the number of supercells per die and the personalization of the metal interconnect. Moreover, by dispersing the input/output supercells among the gate cells, better routability is achieved. The dispersal of the input/output supercells makes it easier to route the gate array than with input/output cells located on the a perimeter of the array, since the input/output supercells are located close to the circuitry that have been routed to perform a prescribed circuit function. As a result, as noted above, the interconnect between supercells and the global routing channels is reduced because interconnection of the input/output does not need to be effected on the perimeter of the die.

While we have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. An integrated circuit architecture comprising:
   an array of circuit devices rows and columns of which are defined by a plurality of first global routing channels distributed among the circuit devices of said array and through which the circuit devices of said array may be selectively interconnected to implement a prescribed signal processing function;
   multiple rows and columns of said array of circuit devices each including first circuit devices each of which is configurable to perform a respective signal processing function and second circuit devices each of which is configurable to effectively perform input/output interfacing between said first circuit devices and signal terminals external of said array;
   each of said first circuit devices being comprised of a second array of third circuit devices rows and columns of which are defined by a plurality of local routing channels distributed among third circuit devices of said second array and through which third circuit devices may be selectively interconnected to define the internal circuitry function of respective ones of said first circuit devices; and wherein
   said second, input/output circuit devices are two-dimensionally interspersed among said first circuit devices throughout said array and contain signal coupling terminal pads therein for providing external signal coupling with respect to the circuit devices of the array, and thereby provide a two-dimensional interspersing of input and output signal coupling ports throughout said array.

2. An integrated circuit architecture according to claim 1, wherein each of said third circuit devices is comprised of an array of programmable logic circuits, functional characteristics of which are definable by the selective interconnection of prescribed components of said logic circuits.

3. An integrated circuit architecture according to claim 1, wherein each second, input/output circuit device contains a plurality of input/output elements and includes a power supply bus network extending from a respective power supply terminal pad to plural input/output elements therein.

4. An integrated circuit architecture according to claim 3, wherein said input/output elements are arranged in rows with input/output elements of adjacent rows having signal coupling terminal pads for effecting input/output signal coupling in mutually opposite signal flow directions.

5. An integrated circuit architecture according to claim 4, wherein each of said second circuit devices includes first and second power supply terminals pads and respective first and second power bus tracks extending therefrom located on opposite sides of each of said second circuit device, and a network for first and second power supply buses extending from said respective first and second power bus tracks to plural input/output circuit elements arranged in the rows of said each second circuit device.

* * * * *